(12) United States Patent
Feng

(10) Patent No.: US 11,444,483 B2
(45) Date of Patent: Sep. 13, 2022

(54) ADAPTIVE STATE ESTIMATION FOR POWER SYSTEMS

(71) Applicant: Hitachi Energy Switzerland AG, Baden (CH)

(72) Inventor: Xiaoming Feng, Cary, NC (US)

(73) Assignee: Hitachi Energy Switzerland AG, Baden (CH)

( * ) Notice: Subject to any disclaimer, the term of this patent is extended or adjusted under 35 U.S.C. 154(b) by 281 days.

(21) Appl. No.: 16/741,882

(22) Filed: Jan. 14, 2020

(65) Prior Publication Data

US 2021/0218273 A1 Jul. 15, 2021

(51) Int. Cl.
*H02J 13/00* (2006.01)
*H02J 3/00* (2006.01)
*G06F 17/17* (2006.01)
*G06Q 10/04* (2012.01)

(52) U.S. Cl.
CPC ........ *H02J 13/00006* (2020.01); *G06F 17/17* (2013.01); *H02J 3/003* (2020.01); *H02J 3/004* (2020.01); *G06Q 10/04* (2013.01); *H02J 2203/10* (2020.01); *H02J 2213/00* (2020.01); *H02J 2310/58* (2020.01)

(58) Field of Classification Search
CPC ...... H02J 13/00006; H02J 3/003; H02J 3/004; H02J 2203/10; H02J 2213/00; H02J 2310/58; H02J 13/00034; H02J 13/00002; H02J 2203/20; G06F 17/17; G06Q 10/04; Y02E 60/00; Y04S 10/30; Y04S 40/12; Y04S 40/20; G01R 19/2513
See application file for complete search history.

(56) References Cited

U.S. PATENT DOCUMENTS

| 2016/0057641 | A1* | 2/2016 | Wigren | H04B 17/345 |
| | | | | 370/252 |
| 2018/0115561 | A1* | 4/2018 | Sun | H04L 63/1416 |
| 2020/0327264 | A1* | 10/2020 | Wang | G06F 30/18 |
| 2020/0379424 | A1* | 12/2020 | Wang | G06Q 50/06 |

OTHER PUBLICATIONS

R. A. M. Van Amerongen, "On Convergence Analysis and Convergence Enhancement of Power System Least-Squares State Estimators," IEEE Transactions on Power Systems, dated Nov. 1995, pp. 2038-2044, vol. 10, No. 4, IEEE, Piscataway, USA.

(Continued)

*Primary Examiner* — Ziaul Karim
(74) *Attorney, Agent, or Firm* — Slater Matsil, LLP

(57) ABSTRACT

Systems, methods, techniques and apparatuses of state estimation are disclosed. One exemplary embodiment is a method comprising determining, with a state estimator, a state estimate based on power grid data corresponding to characteristics of a power grid received from a plurality of local controllers; calculating, with the state estimator, a first gain matrix based on a Gauss-Newton method; updating, with the state estimator, the state estimate based on the first gain matrix; calculating, with the state estimator, a second gain matrix based on Newton's method; updating, with the state estimator, the state estimate based on the second gain matrix; and iteratively recalculating the second gain matrix and updating the state estimate based on the second gain matrix until the state estimate converges.

20 Claims, 4 Drawing Sheets

(56) References Cited

OTHER PUBLICATIONS

S. Pajic et al., "Power System State Estimation via Globally Convergent Methods," IEEE Transactions on Power Systems, dated Nov. 2005, pp. 1683-1689, vol. 20, No. 4, IEEE, Piscataway, USA.
X. T. Jiang et al., "Power state estimation using a direct non-iterative method," International Journal of Electrical Power and Energy Systems, dated May 23, 2015, pp. 361-368, vol. 73, Elsevier, Ltd., Amsterdam, Netherlands.
T. Okon et al., "Comparison of Weighted-Least-Squares Power System State Estimation in Polar and Rectangular Coordinate Systems," 2010 9th International Conference on Environment and Electrical Engineering, dated Jun. 21, 2010, 4 pp., IEEE, Piscataway, USA.
A. Monticelli, "Electric Power System State Estimation," Proceedings of the IEEE, dated Feb. 2000, pp. 262-282, vol. 88, No. 2, IEEE, Piscataway, USA.
A. Abur et al., "2.6 WLS State Estimation Algorithm," Power System State Estimation: Theory and Implementation, dated 2004, 12 pp., Marcel Dekker, Inc., New York, USA.
Dehghanpour, K. et al., "A Survey on State Estimation Techniques and Challenges in Smart Distribution Systems", IEEE Transactions on Smart Grid, IEEE, USA, vol. 10, No. 2, Mar. 2019, pp. 2312-2322, XP011710454, 11 pages total.
Li, X.. et al., "Convergence and Applications of a Gossip-Based Gauss-Newton Algorithm", IEEE Transactions on Signal Processing, IEEE Service Center, New York, NY, US, vol. 61, No. 21, Nov. 2013, pp. 5231-5246, XP011527695, 16 pages total.
Teixeira, A. et al., "Cyber Security Analysis of State Estimators in Electric Power Systems", 49th IEEE Decision and Control (CDC). Dec. 15-17, 2010, pp. 5991-5998, XP031915153, 8 pages total.
Zheng, W. et al., "An Adaptive Distributed Quasi-Newton Method for Power System State Estimation", IEEE Transactions on Smart Grid, IEEE, USA, vol. 10, No. 5, Sep. 2019, pp. 5114-5124, XP011741237, 11 pages total.

\* cited by examiner

ADAPTIVE STATE ESTIMATION FOR POWER SYSTEMS

BACKGROUND

The present disclosure relates generally to state estimation in power systems under both normal and very poor measurement quality conditions. State estimation is an essential and foundational function for power system monitoring, risk analysis, control, and optimization. In order to perform state estimation, data such as sensor measurements or device statuses is collected from components of the power system. Sometimes the quality of the collected data is compromised by gross false data such as malicious data injection or malfunctioning sensors, to name a few examples. Gross false data may prevent state estimation from convergence. Existing state estimation systems suffer from a number of shortcomings and disadvantages. There remain unmet needs including increasing convergence rates and false data detection accuracy. For example, when a state estimation fails to converge, it is impossible perform false data detection and removal. Achieving 100% or near 100% convergence rate for state estimation under any data error condition thus is critical to maintaining uninterrupted situational awareness in power system control. In view of these and other shortcomings in the art, there is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY OF THE DISCLOSURE

Exemplary embodiments of the disclosure include unique systems, methods, techniques and apparatuses for false data detection mitigation systems. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
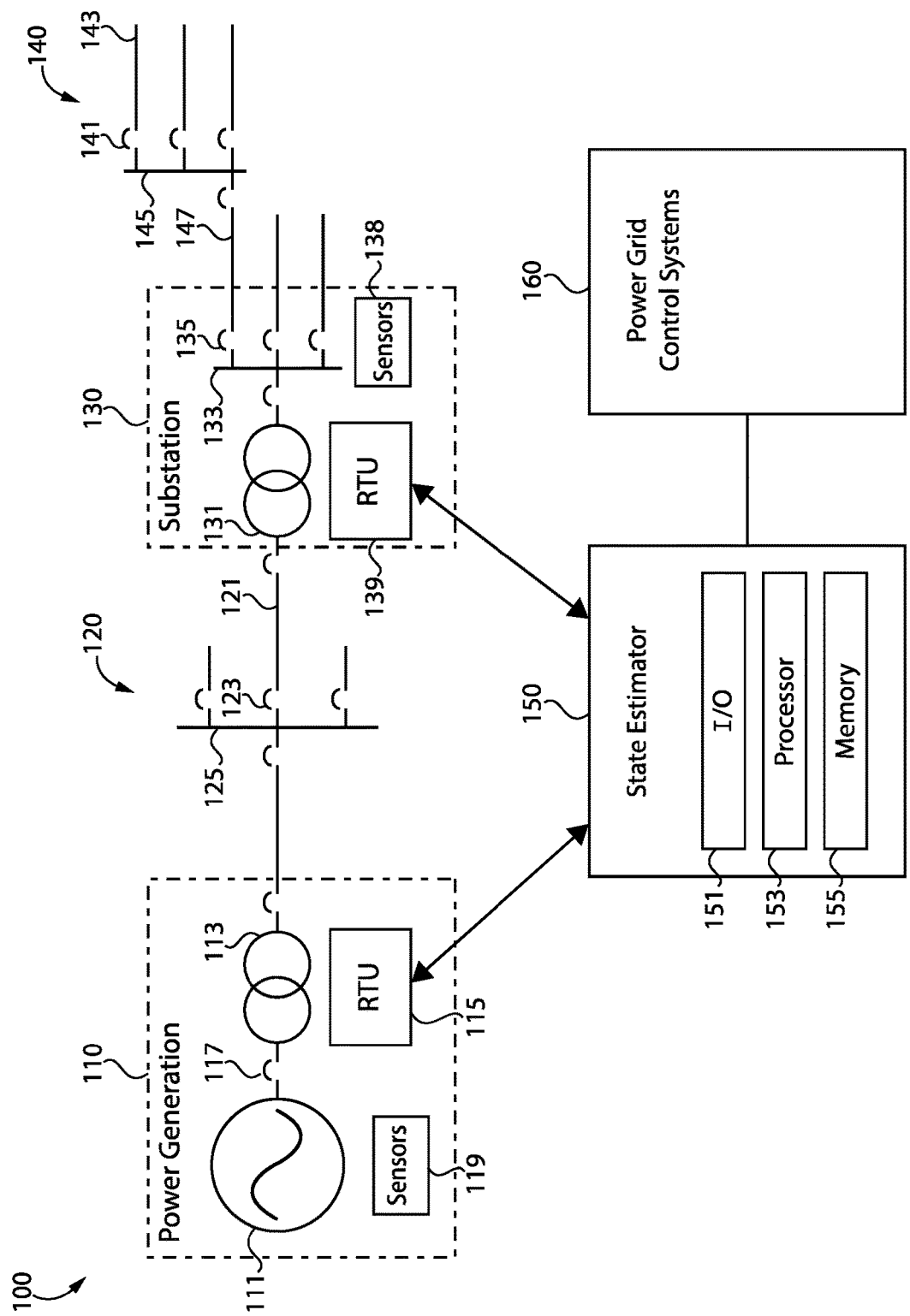
FIG. 1 illustrates an exemplary power grid.

With reference to FIG. 1, there is illustrated an exemplary power grid 100. It shall be appreciated that grid 100 includes a state estimator 150 and power grid controls system 160. State estimator 150 may be implemented in a variety of applications, including power transmission systems, power distribution systems, industrial automation systems, or another type of system structured to generate state estimations based a plurality of collected data. State estimator 150 may be an incorporated into power grid control system 160 such as an energy management system, a distribution management system, an advanced distribution management system, or a microgrid control system, to name but a few examples. It shall be appreciated that the topology of grid 100 is illustrated for the purpose of explanation and is not intended as a limitation of the present disclosure. Although power grid 100 is illustrated with a single line diagram, grid 100 may be structured to transmit single phase, multiphase power or direct current power.

Grid 100 is structured to generate power and provide the generated power to coupled loads. Grid 100 includes a power generation system 110, a transmission network 120, a substation 130, a distribution network 140, and a state estimator 150.

Power generation system 110 includes an AC power source 111, a step up transformer 113, a plurality of controllable devices including circuit breaker 117, a plurality of sensors 119, and remote terminal unit (RTU) 115. AC power source 111 is structured to generate AC power and output the generated power. Transformer 113 is structured to receive the generated power from AC power source 111, step up the voltage of the power, and output the power to transmission network 120. Circuit breaker 117 is structured to selectively isolate AC power source 111 from transmission network 120.

The plurality of sensors 119 is structured to measure electrical characteristics of power generation system 110 and may include voltage sensors, voltage transformers, current sensors, and current transformers, to name but a few examples. RTU 115 is structured to communicate with a plurality of sensors 119, the plurality of controllable devices, and state estimator 150. RTU 115 may receive measurements from a plurality of sensors 119, receive device statuses from controllable devices, and transmit the received data to state estimator 150. The measurements received by RTU 115 may include voltage phase angles, voltage magnitudes, power injection, and power flow, to name but a few examples. The device statuses may include the open/close status for each circuit breaker of power generation system 110, to name but one example. In certain embodiments, either RTU may be replaced with another type of local controller structured to receive data and communicate with state estimator 150.

Transmission network 120 is structured to transmit AC power from transformer 113 to a plurality of substations including substation 130. Network 120 includes a plurality of transmission lines such as transmission line 121; a plurality of controllable devices, such as circuit breaker 123; and transmission bus 125. In certain embodiments, transmission network 120 includes a plurality of sensors structured to measure electrical characteristics of network 120, such as bus voltage magnitudes, bus voltage phase angles, and power flow, to name but a few examples. Transmission network 120 may also include a controller, such as an RTU, structured to receive measurements from the plurality of sensors, receive device statuses from the plurality of controllable devices, and transmit the received data to state estimator 150.

Substation 130 is structured to receive AC power from transmission network 120, step down the voltage of the received power, and output the modified AC power to distribution network 140. Substation 130 includes step down transformer 131; distribution bus 133; a plurality of controllable devices such as circuit breaker 135; a plurality of sensors 138; and RTU 139. Step down transformer 131 is structured to receive AC power from transmission network 120, step down voltage of the received power, and output the modified power to distribution bus 133. Circuit breaker 135 is structured to selectively isolate distribution network 140 from distribution bus 133.

The plurality of sensors 138 is structured to measure electrical characteristics of substation 130 and may include voltage sensors, voltage transformers, current sensors, and current transformers, to name but a few examples. RTU 139 is structured to communicate with a plurality of sensors 138, the plurality of controllable devices, and state estimator 150. RTU 139 may receive measurements from a plurality of sensors 138, receive device statuses from the plurality of controllable devices, and transmit the received data to state estimator 150. The measurements received from RTU 139 may include voltage phase angles, voltage magnitudes, power injection, and power flow, to name but a few examples. The device statuses may include the open/close status for each circuit breaker of substation 130, to name but one example.

Distribution network 140 is structured to transmit AC power received from substation 130 to a plurality of coupled loads. Network 140 includes a plurality of distribution lines, such as distribution lines 147 and 143; a plurality of controllable devices, such as circuit breaker 141; and a distribution bus 145. In certain embodiments, distribution network 140 includes sensors structured to measure electrical characteristics of network 140, such as bus voltage magnitudes, bus voltage phase angles, and power flow, name but a few examples. Distribution network 140 may also include a controller, such as an RTU, structured to receive measurements from the plurality of sensors, receive device statuses from the plurality of controllable devices, and transmit the received data to state estimator 150.

State estimator 150 is structured to receive measurements and device status data from RTU 115 and RTU 139. In certain embodiments, state estimator 150 is structured to receive data from other devices of grid 100, such as intelligent electronic devices, programmable logic controllers, protective relays, phasor measurement units, or microgrid controllers, to name but a few examples.

State estimator 150 is structured to determine the portion of power grid 100 not isolated by a controllable device of grid 100, also known as a power grid topology, using the data received from RTUs 115 and 139. Using the received data and power grid topology, state estimator 150 is structured to estimate a plurality of states of power grid 100, such as a plurality of nodal voltage magnitudes and phase angles, to name but one example.

To estimate a state of power grid 100, state estimator 150 uses a set of equations and matrices described in detail below to determine a series of state estimates. After determining an initial state estimate, the state estimator iteratively updates the state estimate until the updated state estimate converges. To update the value of the state estimate, state estimator 150 calculates a correction, which is added to the previous value of the state estimate. The correction may be calculated using a gain matrix calculated using either the Gauss-Newton method or Newton's Method. State estimator 150 determines which method to use based on a numerical property of the relevant gain matrices. As described in more detail below, state estimator 150 may calculate a first set of corrections using the Gauss-Newton method, then calculate the remaining corrections using Newton's method until the state estimate converges. As shown in more detail below, using the Gauss-Newton method for calculating an initial set of corrections and then Newton's method for the remaining ones produces a higher likelihood of convergence compared to using either method alone.

Once state estimator 150 estimates the plurality of states, state estimator 150 is structured to identify false data received from a data source such as RTU 115 or RTU 139 using the plurality of estimated states, remove the false data from the set of data used to estimate the plurality of states, estimate the plurality of estimated states again without using the false data, and output the converted state estimate for use in a power grid control system 160. The false data may include data received from a malfunctioning sensor or data received from a cyber-intruder, to name but a few examples. The false data may include a single false data point or multiple false data points.

State estimator 150 includes an input/output device 151, a processing device 153, and a memory device 155. State estimator 150 may be a stand-alone device, an embedded system, or a plurality of devices structured to perform the functions described with respect to state estimator 150. For example, state estimator 150 may be a remote server.

Input/output device 151 enables the state estimator 150 to communicate with a plurality of external devices including RTUs 115 and 139. For example, input/output device 151 in different embodiments may include a network adapter, network credential, interface, or a port (e.g., a USB port, serial port, parallel port, an analog port, a digital port, VGA, DVI, HDMI, FireWire, CAT 5, Ethernet, fiber, or any other type of port or interface), to name but a few examples. Input/output device 151 is comprised of hardware, software, and/or firmware. It is contemplated that input/output device 151 includes more than one of these adapters, credentials, or ports, such as a first port for receiving data and a second port for transmitting data.

Processing device 153 may be a programmable type, a dedicated, hardwired state machine, or a combination thereof. Device 153 may include multiple processors, Arithmetic-Logic Units (ALUs), Central Processing Units (CPUs), Digital Signal Processors (DSPs), or a Field-programmable Gate Array (FPGA), to name but a few examples. For forms of processing device 153 with multiple processing units, distributed, pipelined, or parallel processing may be used as appropriate. Processing device 153 may be dedicated to performance of just the operations described herein or may be utilized in one or more additional applications. In the illustrated form, processing device 153 is of a programmable variety that executes processes and processes data in accordance with programming instructions (such as software or firmware) stored in memory device 155. Alternatively or additionally, programming instructions are at least partially defined by hardwired logic or other hardware. Processing device 153 may be comprised of one or more components of any type suitable to process the signals received from input/output device 151 or elsewhere, and provide desired output signals. Such components may include digital circuitry, analog circuitry, or a combination of both.

Memory device 155 may be of one or more types, such as a solid-state variety, electromagnetic variety, optical variety, or a combination of these forms, to name but a few examples. Furthermore, memory device 155 may be volatile, nonvolatile, transitory, non-transitory, or a combination of these types, and some or all of memory device 155 may be of a portable variety, such as a disk, tape, memory stick, or cartridge, to name but a few examples. In addition, memory device 155 may store data that is manipulated by processing device 153, such as data representative of signals received from or sent to input/output device 151 in addition to or in lieu of storing programming instructions, just to name one example.

Power grid control system 160 is structured to receive converged state estimates and execute power grid control applications using the converged state estimates effective to operate grid 100. The power grid control applications may include real time control applications such as contingency analysis, optimal power flow, economic dispatch, volt/var control, or network switching, to name but a few examples. It shall be appreciated that any or all of the foregoing features of the components of grid 100 may also be present in the other components disclosed herein.

Figure 2:
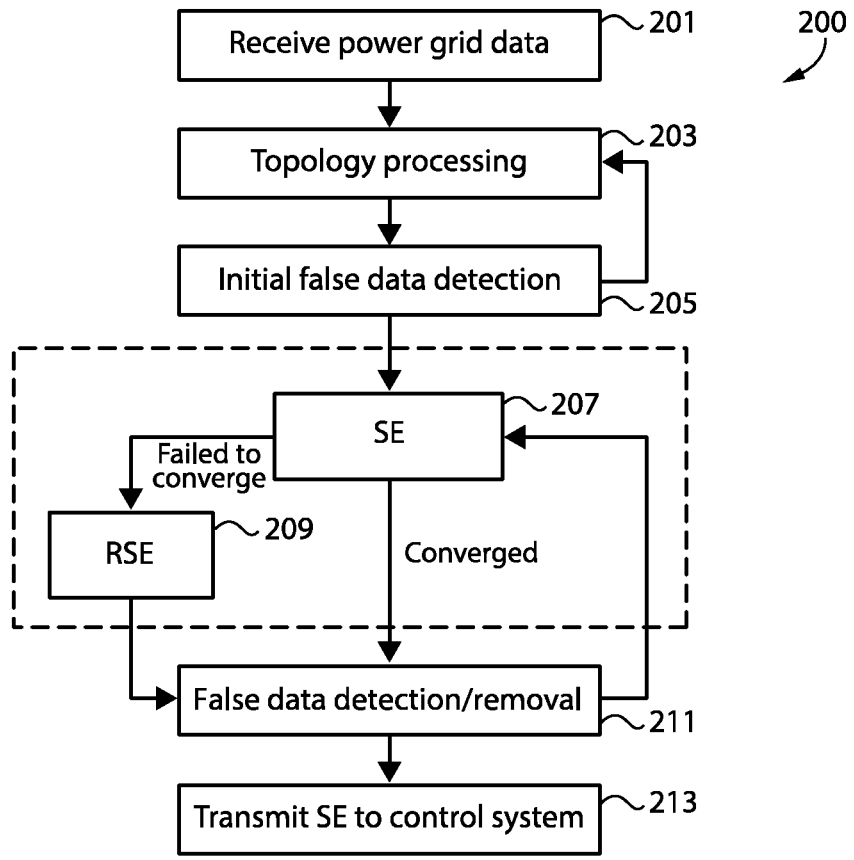
FIG. 2 is a flowchart illustrating an exemplary false data mitigation process.

With reference to FIG. 2, there is a flowchart illustrating an exemplary false data mitigation process 200 for a power grid. Process 200 may be implemented in whole or in part in one of the exemplary state estimators disclosed herein. It shall be appreciated that a number of variations and modifications to process 200 are contemplated including, for example, the omission of one or more aspects of process 200, the addition of further conditionals and operations, or the reorganization or separation of operations and conditionals into separate processes.

Process 200 begins at operation 201 where the state estimator receives power grid data corresponding to electrical or physical characteristics of the power grid. The power grid data may include on/off circuit breaker statuses and measurements including voltage phase angles, voltage magnitudes, power injection, and power flow, to name but a few examples. The sources of the power grid data may include a plurality of sensors and a plurality of circuit breakers.

Process 200 proceeds to operation 203 where topology processing of the power grid using the received power grid data is performed. For example, the on/off circuit breaker statuses may be used to generate a power grid topology. In certain embodiments, the state estimator may receive the power grid topology from another controller or controllers of the power grid.

Process 200 proceeds to operation 205 where the preliminary false data detection and removal is performed. For example, false data may be detected by performing a range or consistency check, to name but a few examples.

Process 200 proceeds to operation 207 where the state estimator attempts to estimate a plurality of states of the power grid by determining a first state estimate, then updating the state estimate iteratively until the state estimate converges using a series of corrections calculated based on the Gauss-Newton method.

If the state estimate converges during operation 207, process 200 proceeds to operation 211. If the state estimate fails to converge, process 200 proceeds to operation 209 where state estimation is performed using a combination of Gauss Newton's method and Newton's method. Once the state estimate converges, process 200 proceeds to operation 209.

During operation 211, the converged state estimate is used to determine whether the power grid data includes false data. If it is determined the power grid data includes false data, the false data is removed from the power grid data, and process 200 returns to operation 207 where state estimation is performed again using power grid data minus the false data. Operations 207, 209, and 211 are repeated until it is determined the power grid data does not include false data. Operation 211 may be performed by the state estimator, or another controller of the power grid.

Once it is determined the power grid data does not include false data, process 200 proceeds to operation 213 where the state estimate is transmitted to one or more grid control applications. The power grid control applications may include real time control applications such as contingency analysis, optimal power flow, economic dispatch, volt/var control, or network switching, to name but a few examples.

Figure 3:
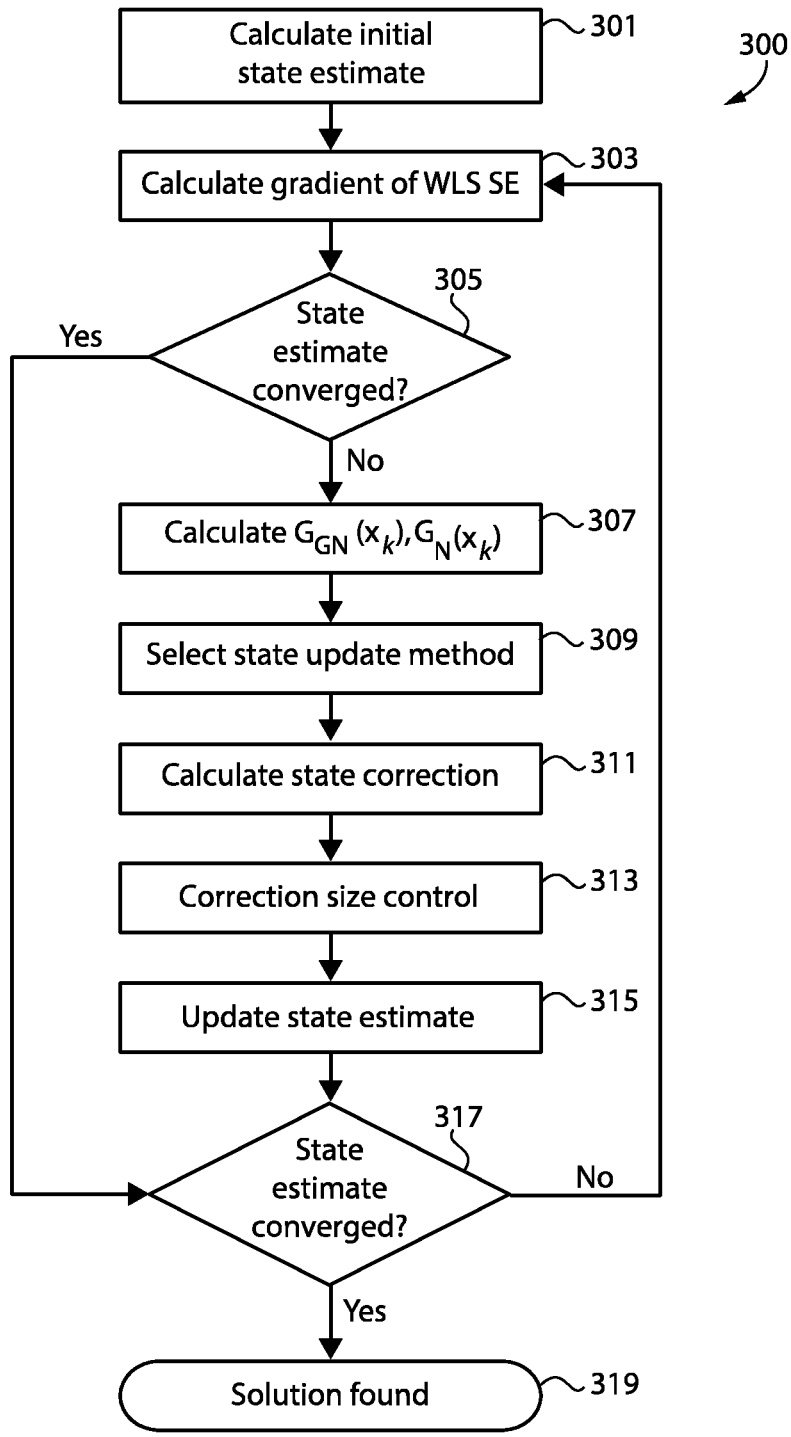
FIG. 3 is a flowchart illustrating an exemplary state estimation process of an exemplary false data mitigation process.

With reference to FIG. 3, there is a flowchart illustrating an exemplary state estimation process 300, such as the state estimation performed in operation 209 in FIG. 2. Process 300 may be implemented in whole or in part in one of the exemplary state estimators disclosed herein. It shall be appreciated that a number of variations and modifications to process 300 are contemplated including, for example, the omission of one or more aspects of process 300, the addition of further conditionals and operations, or the reorganization or separation of operations and conditionals into separate processes.

Process 300 begins at operation 301 where the state estimator determines an initial state estimate using the power grid data. The state estimate may be determined by calculating the state estimate using a set of equations, or the state estimate may be determined based power grid data without using a set of equations, to name but a few examples. The state estimate may include nodal voltage magnitudes, nodal voltage phase angles, current, power flow, and transformer taps, to name but a few examples.

Process 300 proceeds to operation 303 where the state estimator calculates a gradient based on the state estimate. For example, the state estimator may calculate the gradient based on the following equation, where $H(x_k)$ is the measurement function Jacobian matrix at iteration k, h is the measurement function vector, k is the iteration counter, W is a weight matrix including a weight for each step, $\Delta z(x_k)$ is the residual error at iteration k, and $\Delta J(x_k)$ is the gradient of equation (1) at iteration k.

$$J(\Delta x_k) = \tfrac{1}{2}[\Delta z(x_k) - H(x_k)\Delta x_k]^T W [\Delta z(x_k) - H(x_k)\Delta x_k] \quad (1)$$

$$\nabla J(x_k) = -H(x_k)^T W \Delta z \quad (2)$$

Where:

$$H(x_k) = \frac{\partial h(x_k)}{\partial x_k} \quad (3)$$

$$\Delta x_k = x_{k+1} - x_k \quad (4)$$

$$\Delta z(x_k) = z - h(x_k) \quad (5)$$

Process 300 proceeds to conditional 305 where the state estimator determines whether the state estimate has converged. The state estimator may determine whether the state estimate has converged by determining whether the following equation is satisfied, where $\|\nabla J(x_k)\|_\infty$ is the norm of the Jacobian matrix for state estimate vector x at iteration k, and $\varepsilon_j$ is the convergence threshold for the norm.

$$\|\nabla(\Delta x_k)\|_\infty < \varepsilon_j \tag{6}$$

The convergence threshold $\varepsilon_j$ may be $10^{-3}$, $10^{-5}$, or $10^{-7}$ to name but a few examples. If the state estimate has converged, process 300 proceeds to end operation 319 where the state estimator determines the solution is the most recently calculated state estimate. If the state estimate has not converged, process 300 proceeds to operation 307.

During operation 307, the state estimator calculates two gain matrices, one of which will be used for updating the state estimator. A first gain matrix is calculated using the Gauss-Newton method. For example, the first gain matrix may be calculated using the following set of equations, where $G_{GN}(x_k)$ is the Gauss-Newton gain matrix at iteration k, $x_k$ is the estimated state vector at iteration k, H is the Jacobian matrix of measurement functions, and W is the weight matrix:

$$G_{GN}(x_k) = H(x_k)^T W H(x_k) \tag{7}$$

A second gain matrix is calculated using Newton's method. For example, the second gain matrix may be calculated using the following set of equations, where $G_N(x_k)$ is the Newton's Method gain matrix at iteration k, $x_k$ is the estimated state vector at iteration k, H is the Jacobian matrix of measurement functions, W is the weight matrix, i is the measurement index, $w_i$ is a weight for measurement index i, $h_i$ is the measurement function h at measurement index i, and $z_i$ is the power grid data at measurement index i, and $\text{Hess}(h_i(x_k))$ is the Hessian matrix of measurement function of measurement i evaluated at the current state estimate where $\text{Hess}(h_i(x_k)) = \text{Hess}(h_i(x))|_{x=x_k}$.

$$G_N(x_k) = H(x_k)^T W H(x_k) - \Sigma_{i=1}^m w_i \text{Hess}(h_i(x_k))[z_i - h_i(x)] \tag{8}$$

Process 300 then proceeds to operation 309 where the state estimator selects either the Gauss-Newton method or Newton's method for calculating the correction. The state estimator may select the Newton's method if the state estimator determines using the Gauss-Newton method is causing or will cause the state estimate to fail to converge. For example, the state estimator may select Newton's method in response to determining the gain matrix for Newton's method is positive definite.

Process 300 proceeds to operation 311 where the state estimator calculates the correction, also known as calculating the state update, using the selected method. For calculating the correction using the Gauss-Newton method, the following equation may be used:

$$\Delta x_k = G_{GN}(x_k)^{-1} H(x_k)^T W \Delta z(x_k) \tag{9}$$

For calculating the correction using Newton's method, the following equation may be used:

$$\Delta x_k = G_N(x_k)^{-1} H(x_k)^T W \Delta z(x_k) \tag{10}$$

Process 300 proceeds to operation 313 where the state estimator limits the size of the correction calculated in operation 311 to prevent the state estimator from overshooting the solution. For example, the state estimator may use the following set of equations to limit the size of the correction calculated in operation 311, where $\|\Delta x_k\|_\infty$ is the norm of the correction at iteration k, and a is the maximum correction constant.

$$\Delta x_k = x_k * \min\left(1, \frac{\alpha}{\|\Delta x_k\|_\infty}\right) \tag{11}$$

Constant $\alpha$ is determined effective to limit the maximum change to any of the components of state vector $x_k$ in one step. For example, constant $\alpha$ may be 0.05 p.u. for voltage magnitudes or 25 degrees for voltage phase angles.

Process 300 proceeds to operation 315 where the state estimator updates the state estimate by adding the state correction calculated in operations 311 and 313 to the previous state estimate value, as illustrated by the following equation:

$$x_{k+1} = x_k + \Delta x_k \tag{12}$$

Process 300 then proceeds to conditional 317 where the state estimator determines whether the state estimate has converged. The state estimator may determine whether the state estimate has converged by determining whether the following equation is satisfied, where $\|\Delta x_k\|_\infty$ is the norm of the correction at iteration k and $\varepsilon_x$ is the convergence threshold for the norm of the correction:

$$\|\Delta x_k\|_\infty < \varepsilon_x \tag{13}$$

The convergence threshold $\varepsilon_j$ may be $10^{-3}$, $10^{-5}$, or $10^{-7}$ to name but a few examples. If the state estimate has converged, process 300 proceeds to end operation 319 where the state estimator determines the solution is the most recently calculated state estimate. If the state estimate has not converged, process 300 increments the iteration count and returns to operation 303. Process 300 continues to perform operations 303 through 315 until the state estimate converges, as determined by conditionals 305 or 317.

Figure 4:
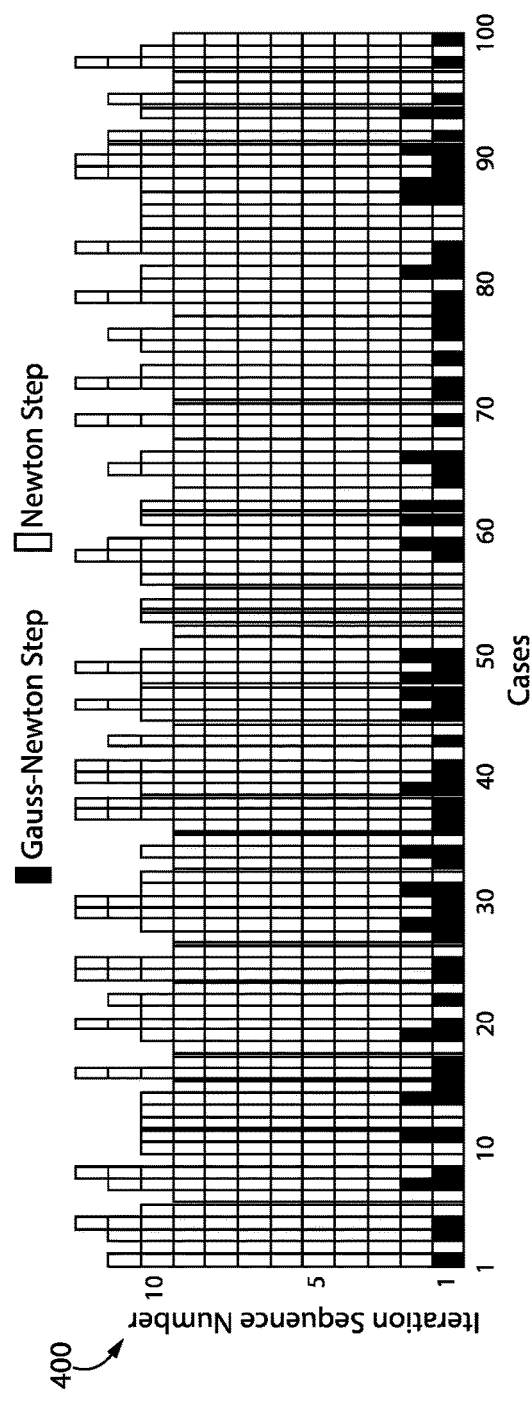
FIG. 4 is a graph illustrating results of a plurality of cases of the exemplary state estimation process illustrated in FIG. 3.

With reference to FIG. 4, there is a graph 400 illustrating one hundred cases of the exemplary state estimation process 300. Graph 400 shows for each of the case how many iterations are needed to converge to a solution and what method is used for each of the iteration. Graph 400 includes a plurality of columns, each column including a plurality of blocks. Each column represents one complete state estimation and each block represents one state estimate of the state estimation. Each state estimate of the state estimation may be updated using the Gauss-Newton method or Newton's method. Each block identified as iteration one is the initial state estimation. For example, Case 1 uses the Gauss-Newton method to update the first iteration, then uses Newton's method to update the remaining ten state estimates, at which point the final state estimate converges.

Figure 5:
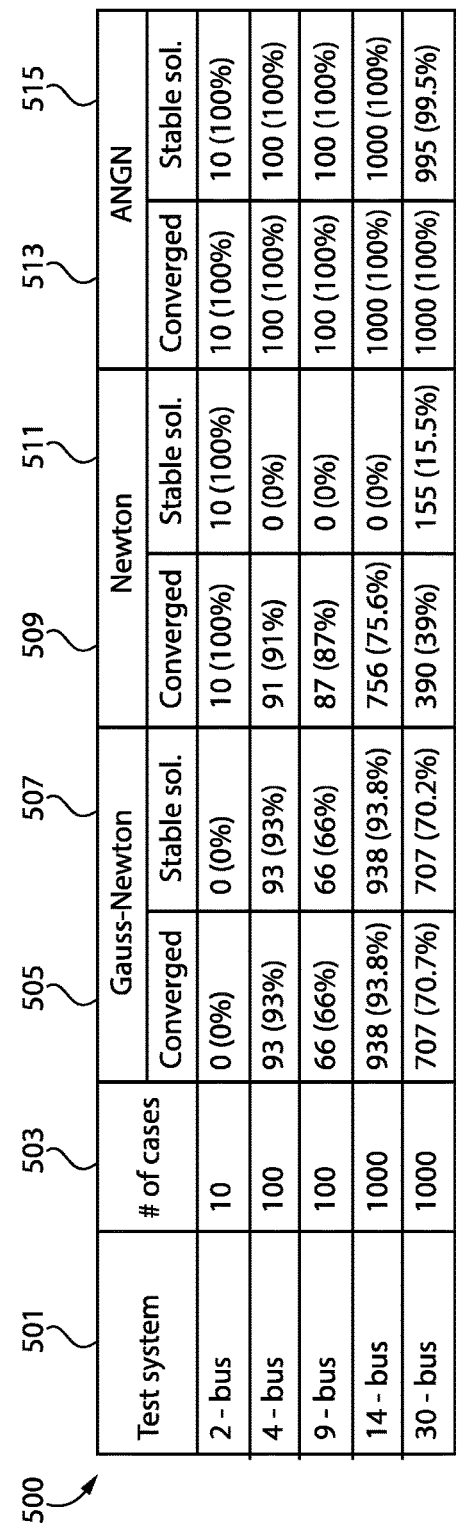
FIG. 5 is a table comparing results of the exemplary state estimation process illustrated in FIG. 3 with conventional state estimation processes.

With reference to FIG. 5, there is illustrated a table 500 illustrating state estimation, under simulated measurement conditions with gross data errors, in test systems of varying complexity using conventional methods and the exemplary state estimation process 300 in FIG. 3. Table 500 includes a plurality of rows, each row corresponding to a test system of a certain complexity. Column 503 indicates the number of cases performed for each test system. The results of the simulated state estimations using the Gauss-Newton method to calculate steps alone is illustrated in columns 505 and 507. The results of the simulated state estimations using Newton's method to calculate corrections alone is illustrated in columns 509 and 511. The results of the simulated state estimations using the exemplary process 300 is illustrated in columns 513 and 515.

The illustrated results include the percentage of cases in which state estimations for each method converged as well as the percentage of cases in which the converged state estimation represented a stable solution. The converged state estimation is stable if the phase angle difference between any two adjacent nodes is less than 90 degrees. As shown by table 500, exemplary state estimation process 300 will converge in a significantly higher percentage of cases compared to either conventional method. Furthermore, exemplary state estimation process 300 reached a stable solution in a significantly higher percentage of cases compared to either conventional method.

Further written description of a number of exemplary embodiments shall now be provided. One embodiment is a method comprising: determining, with a state estimator, a state estimate based on power grid data corresponding to characteristics of a power grid received from a plurality of local controllers; calculating, with the state estimator, a first gain matrix based on a Gauss-Newton method; updating, with the state estimator, the state estimate based on the first gain matrix; calculating, with the state estimator, a second gain matrix based on newton's method; updating, with the state estimator, the state estimate based on the second gain matrix; and iteratively recalculating, with the state estimator, the second gain matrix and updating the state estimate based on the second gain matrix until the state estimate converges.

In certain forms of the foregoing method, updating the state estimate based on the first gain matrix and updating the state estimate based on the second gain matrix is also based on weighted least squares. In certain forms, calculating the first gain matrix based on Gauss-Newton method includes based on the following equation, where $G_{GN}(x_k)$ is the Gauss-Newton gain matrix at iteration k, $x_k$ is an estimated state vector at iteration k, H is a measurement function Jacobian matrix, and W is a weight matrix: $G_{GN}(x_k)=H(x_k)^T W H(x_k)$. In certain forms, calculating the second gain matrix based on Newton's method includes based on the following set of equations: where $G_N(x_k)$ is the Newton's Method gain matrix at iteration k, $x_k$ is the estimated state vector at iteration k, H is the Jacobian matrix of measurement functions, W is the weight matrix, i is the measurement index, $w_i$ is a weight for measurement index i, $h_i$ is the measurement function h at measurement index i, and $z_i$ is the power grid data at measurement index i, and Hess($h_i(x_k)$) is the Hessian matrix of measurement function of measurement i evaluated at the current state estimate: $G_N(x_k)=H(x_k)^T W H(x_k)-\Sigma_{i=1}^m w_i \text{Hess}(h_i(x_k))[z_i-h_i(x)]$. In certain forms, the method comprises selecting, with the state estimator, the second gain matrix, wherein selecting the second gain matrix is in response to determining the second gain matrix is positive definite. In certain embodiments, updating the state estimate based on the second gain matrix includes calculating a correction based on the second gain matrix and adding the correction to the state estimate. In certain forms, the state estimate converges when a norm of the correction is less than a first convergence threshold or wherein a gradient based on the state estimate is less than a second convergence threshold. In certain forms, the size of the correction calculated based on the second gain matrix is limited so as to prevent overshoot. In certain forms, the method further comprises removing false data from the power grid based on the state estimate; calculating a second state estimate based on the power grid data without the false data; iteratively recalculating the second gain matrix and updating the state estimate based on the second gain matrix until the state estimate converges; determining the power grid data does not include false data; and transmitting the state estimate to a power grid control system. In certain forms, the method comprises receiving the power grid data including a plurality of circuit breaker statuses; determine the plurality of circuit breaker statuses includes false data; and update the plurality of circuit breaker statuses by removing the false data from the plurality of circuit breaker statuses, wherein determining the state estimate is based on the plurality of updated circuit breaker statuses.

Another exemplary embodiment is a state estimation system comprising: a plurality of local controllers structured to transmit power grid data corresponding to characteristics of the power grid; and a state estimator including a processing device configured to execute a set of instructions effective to: determine a state estimate based on power grid data corresponding to characteristics of the power grid received from a plurality of local controllers, calculate a first gain matrix based on Gauss-Newton method, update the state estimate based on the first gain matrix, calculate a second gain matrix based on Newton's method, update the state estimate based on the second gain matrix, and iteratively recalculate the second gain matrix and update the state estimate based on the second gain matrix until the state estimate converges.

In certain forms of the foregoing state estimation system, updating the state estimate based on the first gain matrix and updating the state estimate based on the second gain matrix is also based on weighted least squares. In certain forms, calculating the first gain matrix based on Gauss-Newton method includes based on the following equation, where $G_{GN}(x_k)$ is the Gauss-Newton gain matrix at iteration k, $x_k$ is an estimated state vector at iteration k, H is a measurement function Jacobian matrix, and W is a weight matrix: $G_{GN}(x_k)=H(x_k)^T W H(x_k)$. In certain forms, wherein calculating the second gain matrix based on Newton's method includes based on the following equation where $G_N(x_k)$ is the Newton's Method gain matrix at iteration k, $x_k$ is the estimated state vector at iteration k, H is the Jacobian matrix of measurement functions, W is the weight matrix, i is the measurement index, $w_i$ is a weight for measurement index i, $h_i$ is the measurement function h at measurement index i, and $z_i$ is the power grid data at measurement index i, and Hess($h_i(x_k)$) is the Hessian matrix of measurement function of measurement i evaluated at the current state estimate: $G_N(x_k)=H(x_k)^T W H(x_k)-\Sigma_{i=1}^m w_i \text{Hess}(h_i(x_k))[z_i-h_i(x)]$. In certain forms, the processing device is further configured to execute the set of instructions further effective to select the second gain matrix in response to determining the second gain matrix is positive definite. In certain forms, updating the state estimate based on the second gain matrix includes calculating a correction based on the second gain matrix and adding the correction to the state estimate. In certain forms, the state estimate converges when a norm of the correction is less than a first convergence threshold or wherein a gradient based on the state estimate is less than a second convergence threshold. In certain forms, the size of the correction calculated based on the second gain matrix is limited so as to prevent overshoot. In certain forms, the processing device is configured to execute the set of instructions further effective to: remove the false data from the power grid data; calculate a second state estimate based on the power grid data without the false data; iteratively recalculate the second gain matrix and update the second state estimate based on the second gain matrix until the second state estimate converges; determine the power grid data does not include false data; and transmit the second state estimate to a power grid control system. In certain forms, the processing device is further configured to execute the set of instructions further effective to: receive the power grid data including a plurality of circuit breaker statuses; determine the plurality of circuit breaker statuses includes false data;

and update the plurality of circuit breaker statuses by removing the false data from the plurality of circuit breaker statuses, wherein determining the state estimate is based on the plurality of updated circuit breaker statuses.

It is contemplated that the various aspects, features, processes, and operations from the various embodiments may be used in any of the other embodiments unless expressly stated to the contrary. Certain operations illustrated may be implemented by a computer including a processing device executing a computer program product on a non-transient, computer-readable storage medium, where the computer program product includes instructions causing the processing device to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary. The term "based on" includes using an identified value to perform a function.

What is claimed is:

1. A method comprising: receiving, by a state estimator of a power grid, power grid data from a plurality of sensors in the power grid, from a plurality of local controllers in the power grid, or from both, wherein the power grid data correspond to characteristics of the power grid; determining, with the state estimator, a state estimate based on the power grid data; calculating, with the state estimator, a first gain matrix based on a Gauss-Newton method; updating, with the state estimator, the state estimate based on the first gain matrix; calculating, with the state estimator, a second gain matrix based on Newton's method; updating, with the state estimator, the state estimate based on the second gain matrix; iteratively recalculating, with the state estimator, the second gain matrix and updating the state estimate based on the second gain matrix until the state estimate converges; and sending, by the state estimator, the converged state estimate to a power grid controller of the power grid, wherein the power grid controller is configured to execute at least one power grid control application based on the converged state estimate.

2. The method of claim 1 wherein updating the state estimate based on the first gain matrix and updating the state estimate based on the second gain matrix is also based on weighted least squares.

3. The method of claim 2 wherein calculating the first gain matrix based on Gauss-Newton method includes based on the following equation, where $G_{GN}(X_k)$ is the Gauss-Newton gain matrix at iteration k, $X_k$ is an estimated state vector at iteration k, H is a measurement function Jacobian matrix, and W is a weight matrix:

$$G_{GN}(X_k) = H(X_k)^T W H(X_k)$$

4. The method of claim 3 wherein calculating the second gain matrix based on Newton's method includes based on the following set of equations: where $G_N(X_k)$ is the Newton's Method gain matrix at iteration k, $X_k$ is the estimated state vector at iteration k, H is the Jacobian matrix of measurement functions, W is the weight matrix, i is the measurement index, $w_i$ is a weight for measurement index i, $h_i$ is the measurement function h at measurement index i, and $z_i$ is the power grid data at measurement index i, and $\text{Hess}(h_i(X_k))$ is the Hessian matrix of measurement function of measurement i evaluated at the current state estimate:

$$G_N(X_k) = H(X_k)^T W H(X_k) - \Sigma_{i=1}^m w_i \text{Hess}(h_i(X_k))[z_i - h_i(X)]$$

5. The method of claim 1 further comprising selecting, with the state estimator, the second gain matrix, wherein selecting the second gain matrix is in response to determining the second gain matrix is positive definite.

6. The method of claim 1 wherein updating the state estimate based on the second gain matrix includes calculating a correction based on the second gain matrix and adding the correction to the state estimate.

7. The method of claim 6 wherein the state estimate converges when a norm of the correction is less than a first convergence threshold or when a gradient based on the state estimate is less than a second convergence threshold.

8. The method of claim 6 wherein the size of the correction calculated based on the second gain matrix is limited so as to prevent overshoot.

9. The method of claim 1 further comprising:
removing false data from the power grid data based on the state estimate;
calculating a second state estimate based on the power grid data without the false data;
iteratively recalculating the second gain matrix and updating the second state estimate based on the second gain matrix until the second state estimate converges;
determining the power grid data does not include false data; and
transmitting the second state estimate to the power grid controller.

10. The method of claim 1 further comprising:
receiving the power grid data including a plurality of circuit breaker statuses;
determining the plurality of circuit breaker statuses includes false data; and
updating the plurality of circuit breaker statuses by removing the false data from the plurality of circuit breaker statuses,
wherein determining the state estimate is based on the plurality of updated circuit breaker statuses.

11. A power grid comprising:
a plurality of local controllers structured to transmit power grid data corresponding to characteristics of the power grid;

a state estimator including a processing device configured to execute a set of instructions effective to:
determine a state estimate based on the power grid data received from the plurality of local controllers,
calculate a first gain matrix based on Gauss-Newton method,
update the state estimate based on the first gain matrix,
calculate a second gain matrix based on Newton's method,
update the state estimate based on the second gain matrix,
iteratively recalculate the second gain matrix and update the state estimate based on the second gain matrix until the state estimate converges, and
after the state estimate converges, send the state estimate to a power grid controller of the power grid; and
the power grid controller configured to:
receive the state estimate sent by the state estimator; and
control operation of the power grid using the received state estimate.

12. The power grid of claim 11 wherein updating the state estimate based on the first gain matrix and updating the state estimate based on the second gain matrix is also based on weighted least squares.

13. The power grid of claim 12 wherein calculating the first gain matrix based on Gauss-Newton method includes based on the following equation, where $G_{GN}(X_k)$ is the Gauss-Newton gain matrix at iteration k, $X_k$ is an estimated state vector at iteration k, H is a measurement function Jacobian matrix, and W is a weight matrix:

$$G_{GN}(X_k)=H(X_k)^T W H(X_k)$$

14. The power grid of claim 13 wherein calculating the second gain matrix based on Newton's method includes based on the following equation where $G_N(X_k)$ is the Newton's Method gain matrix at iteration k, $X_k$ is the estimated state vector at iteration k, H is the Jacobian matrix of measurement functions, W is the weight matrix, i is the measurement index, $w_i$ is a weight for measurement index i, $h_i$ is the measurement function h at measurement index i, and $z_i$ is the power grid data at measurement index i, and $\text{Hess}(h_i(X_k))$ is the Hessian matrix of measurement function of measurement i evaluated at the current state estimate:

$$G_N(X_k)=H(X_k)^T W H(X_k)-\Sigma_{i=1}^m w_i \text{Hess}(h_i(X_k))[z_i-h_i(X)]$$

15. The power grid of claim 11 wherein the processing device is further configured to execute the set of instructions further effective to select the second gain matrix in response to determining the second gain matrix is positive definite.

16. The power grid of claim 11 wherein updating the state estimate based on the second gain matrix includes calculating a correction based on the second gain matrix and adding the correction to the state estimate.

17. The power grid of claim 16 wherein the state estimate converges when a norm of the correction is less than a first convergence threshold or when a gradient based on the state estimate is less than a second convergence threshold.

18. The power grid of claim 16 wherein the size of the correction calculated based on the second gain matrix is limited so as to prevent overshoot.

19. The power grid of claim 11 wherein the processing device is configured to execute the set of instructions further effective to:
remove false data from the power grid data;
calculate a second state estimate based on the power grid data without the false data;
iteratively recalculate the second gain matrix and update the second state estimate based on the second gain matrix until the second state estimate converges;
determine the power grid data does not include false data; and
transmit the second state estimate to the power grid controller.

20. The method of claim 1 wherein the power grid data is not received from the plurality of sensors.

* * * * *

UNITED STATES PATENT AND TRADEMARK OFFICE
CERTIFICATE OF CORRECTION

PATENT NO. : 11,444,483 B2
APPLICATION NO. : 16/741882
DATED : September 13, 2022
INVENTOR(S) : Xiaoming Feng It is certified that error appears in the above-identified patent and that said Letters Patent is hereby corrected as shown below:

In the Claims

Claim 4, Column 12, Lines 24-26; delete "$G_N(X_k)=H(X_k)^T WH(X_k)-\Sigma_{i=1}^m w_i \text{Hess}(h_i(X_k))[z_i-h_i(X)]$" and insert --$G_N(X_k) = H(X_k)^T WH(X_k) - \sum_{i=1}^m w_i Hess(h_i(X_k))[z_i - h_i(X)]$--.

Claim 14, Column 14, Lines 6-8; delete "$G_N(X_k)=H(X_k)^T WH(X_k)-\Sigma_{i=1}^m w_i \text{Hess}(h_i(X_k))[z_i-h_i(X)]$" and insert --$G_N(X_k) = H(X_k)^T WH(X_k) - \sum_{i=1}^m w_i Hess(h_i(X_k))[z_i - h_i(X)]$--.

Signed and Sealed this
First Day of November, 2022

Katherine Kelly Vidal
*Director of the United States Patent and Trademark Office*